United States Patent
Okuda et al.

(10) Patent No.: US 9,356,576 B2
(45) Date of Patent: May 31, 2016

(54) FILTER DEVICE

(71) Applicant: Murata Manufacturing Co., Ltd., Nagaokakyo-shi, Kyoto-fu (JP)

(72) Inventors: Tetsuro Okuda, Nagaokakyo (JP); Koichiro Kawasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/606,110

(22) Filed: Jan. 27, 2015

(65) Prior Publication Data

US 2015/0137909 A1 May 21, 2015

Related U.S. Application Data

(63) Continuation of application No. PCT/JP2013/070912, filed on Aug. 1, 2013.

(30) Foreign Application Priority Data

Aug. 30, 2012 (JP) .................. 2012-189541

(51) Int. Cl.
*H03H 9/72* (2006.01)
*H03H 9/70* (2006.01)
*H03H 9/05* (2006.01)
(Continued)

(52) U.S. Cl.
CPC .................. *H03H 9/725* (2013.01); *H03H 7/01* (2013.01); *H03H 9/0571* (2013.01); *H03H 9/0576* (2013.01); *H03H 9/6483* (2013.01); *H03H 9/706* (2013.01); *H03H 7/46* (2013.01);
(Continued)

(58) Field of Classification Search
CPC ......... H03H 7/01; H03H 7/46; H03H 9/0576; H03H 9/46; H03H 9/6483; H03H 9/725; H03H 9/0009; H03H 9/0057; H03H 9/706; H03H 9/0571
USPC .......................... 333/133, 187, 188, 193–196
See application file for complete search history.

(56) References Cited

U.S. PATENT DOCUMENTS

| | | | |
|---|---|---|---|
| 7,978,019 B2 * | 7/2011 | Wiesbauer | H01P 1/213 333/12 |
| 2006/0091977 A1 | 5/2006 | Inoue et al. | |
| 2009/0284328 A1 | 11/2009 | Wiesbauer et al. | |

FOREIGN PATENT DOCUMENTS

| | | |
|---|---|---|
| JP | 62-261211 A | 11/1987 |
| JP | 03-272213 A | 12/1991 |
| JP | 10-256809 A | 9/1998 |
| JP | 2006-135447 A | 5/2006 |
| JP | 2010-514284 A | 4/2010 |

OTHER PUBLICATIONS

Official Communication issued in International Patent Application No. PCT/JP2013/070912, mailed on Nov. 5, 2013.

(Continued)

*Primary Examiner* — Benny Lee
*Assistant Examiner* — Jorge Salazar, Jr.
(74) *Attorney, Agent, or Firm* — Keating & Bennett, LLP

(57) ABSTRACT

A filter device includes a first signal terminal, a second signal terminal, a filter unit, a first inductor and a second inductor. The filter unit is connected between the first signal terminal and the second signal terminal. The first inductor is connected between a connection point between the filter unit and the first signal terminal, and a ground potential. The second inductor is connected between the filter unit and the second signal terminal. The second inductor is electromagnetically coupled with the first inductor.

15 Claims, 3 Drawing Sheets

(51) Int. Cl.
*H03H 9/64* (2006.01)
*H03H 7/01* (2006.01)
*H03H 7/46* (2006.01)
*H03H 9/46* (2006.01)
*H03H 9/00* (2006.01)

(52) U.S. Cl.
CPC ........... *H03H 9/0009* (2013.01); *H03H 9/0057* (2013.01); *H03H 9/46* (2013.01)

(56) References Cited

OTHER PUBLICATIONS

Official Communication issued in Japanese Patent Application No. 2013-552758, mailed on Jan. 21, 2014.
Official Communication issued in Japanese Patent Application No. 2013-552758, mailed on May 13, 2014.

\* cited by examiner

FILTER DEVICE

BACKGROUND OF THE INVENTION

1. Field of the Invention

The present invention relates to filter devices.

2. Description of the Related Art

To date, filter devices that utilize elastic waves such as surface acoustic waves or boundary acoustic waves have been mounted in communication devices such as cellular phones. For example, in Japanese Unexamined Patent Application Publication No. 62-261211, a filter device is described in which a loosely coupled transformer is connected in parallel with a main filter and a signal having a same level as and a phase opposite to a direct wave mixes with and cancels out the direct wave. In this filter device, a direct wave is canceled out and therefore attenuation in a stopband can be made large.

In recent years, the demand for further decreases in the size of filter devices has been increasing without a solution.

SUMMARY OF THE INVENTION

Preferred embodiments of the present invention provide a compact filter device that has large attenuation in a stopband.

A filter device according to a preferred embodiment of the present invention includes a first signal terminal, a second signal terminal, a filter unit, a first inductor and a second inductor. The filter unit is connected between the first signal terminal and the second signal terminal. The first inductor is connected between a connection point between the filter unit and the first signal terminal, and a ground potential. The second inductor is connected between the filter unit and the second signal terminal. The second inductor is electromagnetically coupled with the first inductor.

In a certain specific aspect of the filter device according to a preferred embodiment of the present invention, the filter device includes a substrate, an inductor chip and a wiring line. The inductor chip defines the first inductor. The inductor chip is mounted on the substrate. The wiring line is provided inside the substrate. The wiring line defines the second inductor.

In another specific aspect of the filter device according to a preferred embodiment of the present invention, the inductor chip and the wiring line face each other in a thickness direction of the substrate.

In another specific aspect of the filter device according to a preferred embodiment of the present invention, the inductor chip and the wiring line face each other without there being any electrodes therebetween.

In yet another specific aspect of the filter device according to a preferred embodiment of the present invention, the filter device further includes a third signal terminal and one other filter unit. The other filter unit is connected between a connection point between the first signal terminal and the filter unit, and the third signal terminal. The other filter unit and the filter unit have different passbands compared to each other. The first and second inductors are configured such that a signal that has a phase and amplitude that weaken a signal located in a passband of the other filter unit that passes through the filter unit flows from one of the first and second signal terminals to the other of the first and second signal terminals by passing through the first and second inductors, which are electromagnetically coupled with each other, and not passing through the filter unit.

In yet another specific aspect of the filter device according to a preferred embodiment of the present invention, the first and second inductors are configured such that a signal that has a phase that is opposite to that of a signal of at least a portion of a frequency band of the signals located in the passband of the other filter unit that passes through the filter unit flows from one of the first and second signal terminals to the other of the first and second signal terminals by passing through the first and second inductors, which are electromagnetically coupled with each other, and not passing through the filter unit.

In yet another specific aspect of the filter device according to a preferred embodiment of the present invention, the first and second inductors are configured such that the signal of at least a portion of the frequency band of the signals located in the passband of the other filter unit that passes through the filter unit, and the signal that flows from one of the first and second signal terminals to the other of the first and second signal terminals by passing through the first and second inductors, which are electromagnetically coupled with each other, and not passing through the filter unit have phases opposite to each other and the same amplitude.

In another specific aspect of the filter device according to a preferred embodiment of the present invention, the filter unit preferably is an unbalanced filter unit that outputs an unbalanced signal.

In yet another specific aspect of the filter device according to a preferred embodiment of the present invention, the first signal terminal preferably is an antenna signal terminal that is connected to an antenna. In addition, the second signal terminal preferably is a transmission signal terminal that is connected to a transmission circuit. The filter unit preferably is a ladder-type elastic wave filter circuit that includes a series-arm resonator and a parallel-arm resonator.

In yet another specific aspect of the filter device according to a preferred embodiment of the present invention, the third signal terminal preferably is a reception signal terminal that is connected to a reception circuit. The other filter unit preferably is a longitudinally coupled resonator type elastic wave filter circuit.

According to various preferred embodiments of the present invention, a compact filter device that has large attenuation in a stop band is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
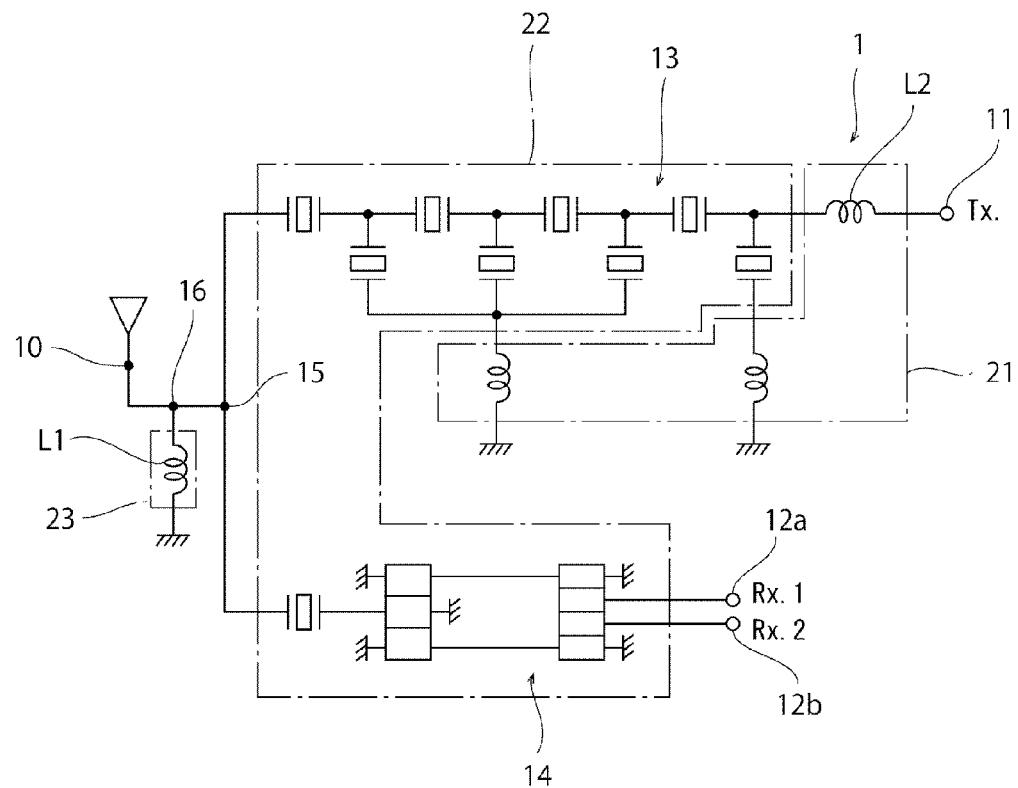
FIG. 1 is a schematic equivalent circuit diagram of a filter device according to a preferred embodiment of the present invention.

Hereafter, various non-limiting examples of preferred embodiments of the present invention will be described. However the following preferred embodiments are merely illustrative examples. The present invention is in no way limited to the following preferred embodiments.

In addition, in the drawings referred to in the descriptions of preferred embodiments and so forth, members having the same or substantially the same functions are referred to using the same symbols. In addition, the drawings referred to in the descriptions of preferred embodiments and so forth are schematic drawings. The dimensional ratios and so forth of bodies drawn in the drawings may differ from the actual dimensional ratios and so forth of the bodies.

The dimensional ratios and so forth of bodies may also differ from drawing to drawing. The specific dimensional ratios and so forth of bodies should be determined by referring to the following description.

FIG. 1 is a schematic equivalent circuit diagram of a filter device 1 according to a preferred embodiment of the present invention. First, a circuit configuration of the filter device 1 will be described while referring to FIG. 1.

The filter device 1 preferably includes an antenna signal terminal 10, which defines and serves as a first signal terminal, a transmission signal terminal 11, which defines and serves as a second signal terminal, and reception signal terminals 12a and 12b, which define and serve as third signal terminals. The antenna signal terminal 10 is connected to an antenna.

A transmission filter unit 13 is connected in series between the antenna signal terminal 10 and the transmission signal terminal 11. The transmission filter unit 13 preferably is an unbalanced filter unit that outputs an unbalanced signal to the antenna signal terminal 10. Specifically, the transmission filter unit 13 is defined by a ladder-type elastic wave filter unit.

A reception filter unit 14 is connected in series between the antenna signal terminal 10 and the reception signal terminals 12a and 12b. The reception filter unit 14 may be defined by an unbalanced filter unit, but, in this preferred embodiment, is preferably defined by a balanced filter unit that is configured to output a balanced signal to the reception signal terminals 12a and 12b. Specifically, the reception filter unit is preferably defined by a longitudinally coupled resonator type elastic wave filter unit.

A transmission frequency band, which is a passband of the transmission filter unit 13, and a reception frequency band, which is a passband of the reception filter unit 14, are different from each other. The transmission frequency band is located in a stop band of the reception filter unit 14. The reception frequency band is located in a stop band of the transmission filter unit 13.

A first inductor L1 is connected in series between a connection point 16, which is between a connection point 15 between the transmission filter unit 13 and the reception filter unit 14, and the antenna signal terminal 10, and the ground potential. A second inductor L2 is connected in series between the transmission filter unit 13 and the transmission signal terminal 11. The first and second inductors L1 and L2, which are inductors configured to adjust impedance, are also inductors configured to define a sub-route to increase attenuation in the reception frequency band in the transmission filter unit 13.

Figure 2:
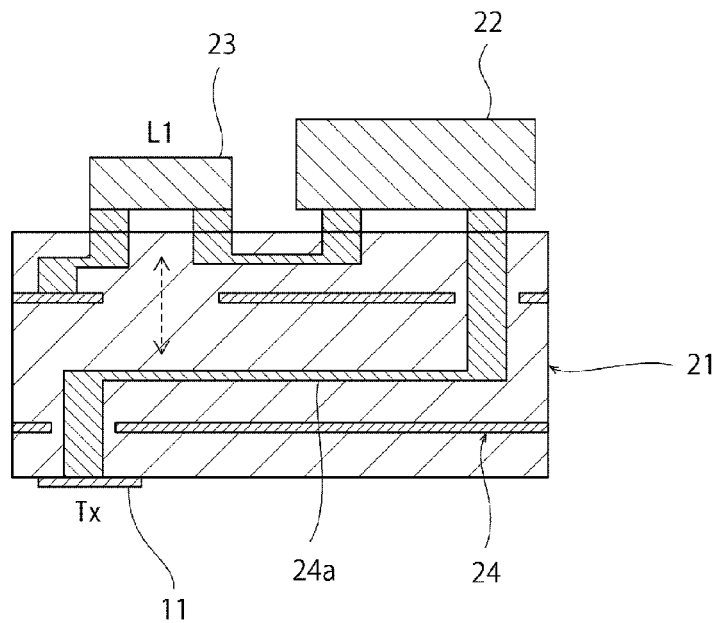
FIG. 2 is a schematic sectional view of the filter device according to a preferred embodiment of the present invention.

FIG. 2 is a schematic sectional view of the filter device 1 according to a preferred embodiment of the present invention. Next, a specific configuration of the filter device 1 will be described while mainly referring to FIG. 2.

The filter device 1 includes a wiring board 21. A filter chip 22 and an inductor chip 23 are mounted on the wiring board 21.

The filter chip 22 defines at least a portion of the transmission filter unit 13 and the reception filter unit 14. Specifically, the filter chip 22 defines substantially the entirety of the transmission filter unit 13 and the reception filter unit 14 except for the inductors. The inductor chip 23 defines the first inductor L1.

A wiring line 24 is provided inside the wiring substrate 21. The wiring line 24 includes a wiring line 24a, which defines the second inductor L2. The wiring line 24a faces the inductor chip 23, which defines the first inductor L1, in a thickness direction of the wiring board 21. No other electrodes are provided in a portion of the wiring board 21 located between at least a portion of the wiring line 24a and the inductor chip 23. That is, the inductor chip 23 and the wiring line 24a face each other in the thickness direction with no other electrodes therebetween. Consequently, the first inductor L1, which is provided in the inductor chip 23, and the second inductor L2, which is defined by the wiring line 24a, are electromagnetically coupled with each other. Therefore, a sub-route is provided between the transmission signal terminal 11 and the antenna signal terminal 10 that passes through the first and second inductors L1 and L2, which are electromagnetically coupled with each other, but does not pass through the transmission filter unit 13.

Figure 3:
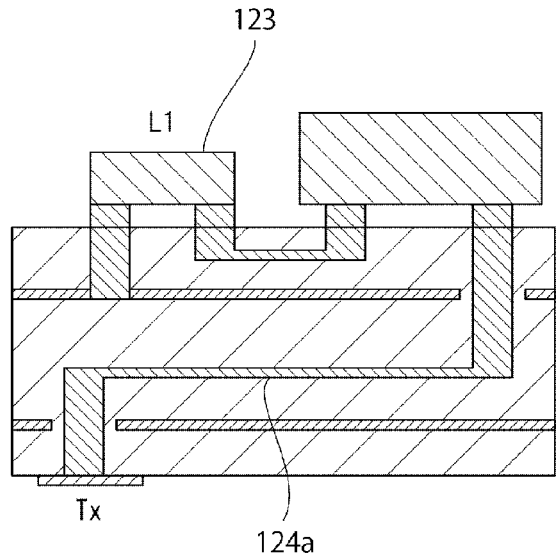
FIG. 3 is a schematic sectional view of a filter device according to a reference example.

For example, as illustrated in FIG. 3, in the case where another electrode (in particular, a ground electrode) is provided between a wiring line 124a, which defines a second inductor, and an inductor chip 123, which defines a first inductor, the other electrode defines and functions as an electric field shield. Consequently, the first inductor and the second inductor are prevented from becoming electromagnetically coupled with each other. Therefore, as in this preferred embodiment, it is preferable that the inductor chip 23 and the wiring line 24a face each other in the thickness direction with no other electrodes therebetween.

The first and second inductors L1 and L2 are configured such that a signal having a phase and amplitude that weakens a signal of the reception frequency band that passes through the transmission filter unit 13 flows from the transmission signal terminal 11 to the antenna signal terminal 10 by passing along the sub-route defined by the first and second inductors L1 and L2, which are electromagnetically coupled with each other, and not passing through the transmission filter unit 13. Consequently, the strength of the signal of the reception frequency band which passes through the transmission filter unit 13 is reduced. Therefore, increased attenuation in the stop band of the transmission filter unit 13 and an improvement in isolation characteristics of the transmission filter unit 13 in the reception frequency band of the reception filter unit 14 is achieved.

In order to achieve a further increase in attenuation in the stop band of the transmission filter unit 13 and a further improvement in the isolation characteristics of the transmission filter unit 13 in the reception frequency band of the reception filter unit 14, it is preferable that the first and second inductors L1 and L2 be configured such that a signal having a phase opposite to that of a signal of at least a portion of the frequency band of the signals of the reception frequency band that passes through the transmission filter unit 13 flows from the transmission signal terminal 11 to the antenna signal terminal 10 by passing along the sub-route and not passing through the transmission filter unit 13. It is further preferable that the first and second inductors L1 and L2 be configured such that a signal of at least a portion of the frequency band of the signals of the reception frequency band that passes through the transmission filter unit 13 and a signal that flows from the transmission signal terminal 11 to the antenna signal terminal 10 by passing along the sub-route and not passing through the transmission filter unit 13 have phases opposite to each other and the same amplitude.

Figure 4:
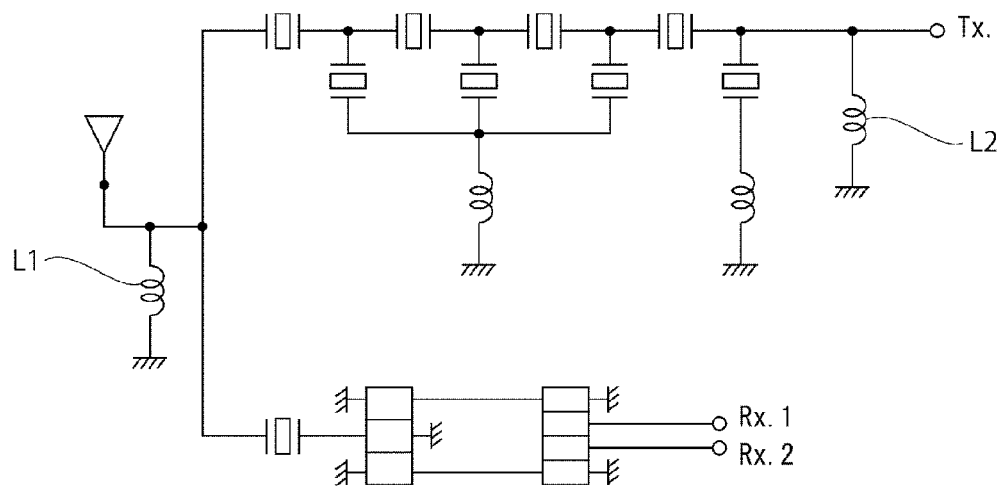
FIG. 4 is a schematic equivalent circuit diagram of a filter device according to a comparative example.

Incidentally, the above-described sub-route, for example, as illustrated in FIG. 4, is preferably formed by electromagnetically coupling the inductors L1 and L2, which are connected between a signal line and the ground potential. This is because, in the case where an inductor is connected in series with a signal line, since the inductor is a resistance component, insertion loss is increased in the passband of the filter unit to which the inductor is serially connected.

However, as a result of diligence studies conducted by the present inventors, it was discovered that the inductance of the second inductor L2 is reduced in the case where the inductor L2 is connected in series between the transmission filter unit 13 and the transmission signal terminal 11, as in the present preferred embodiment, compared with the case where the inductor L2 is connected between a signal line and the ground potential as illustrated in FIG. 4. In this preferred embodiment, since the inductance of the second inductor L2 is reduced, even in the case where the second inductor L2 is connected between the transmission filter unit 13 and the transmission signal terminal 11, insertion loss in the passband of the transmission filter unit 13 is not degraded or not significantly degraded.

In order to clarify this point, a non-limiting example of a filter device having substantially the same configuration as the filter device 1 according to the first preferred embodiment was manufactured (example). In addition, as illustrated in FIG. 4, a filter device having substantially the same configuration as the filter device according to the example, except that the second inductor L2 is connected between a connection point between the transmission filter unit and the transmission signal terminal, and the ground potential, was manufactured (comparative example).

In addition, in the example, the inductance of the first inductor L1 was made to be 7.5 nH and the inductance of the second inductor L2 was made to be 1.0 nH.

On the other hand, in the comparative example, the inductance of the first inductor L1 was made to be 7.5 nH and the inductance of the second inductor L2 was made to be 62 nH.

Figure 5:
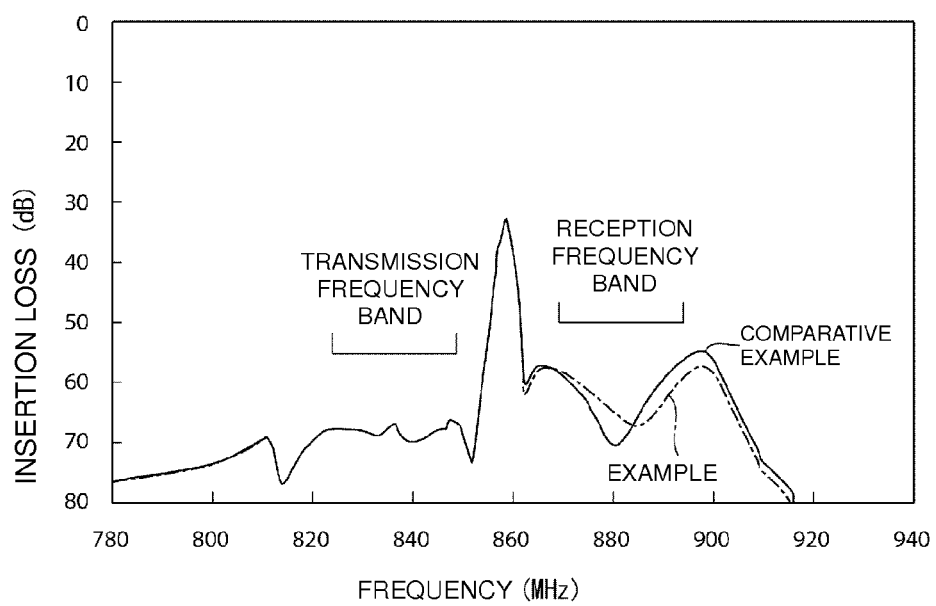
FIG. 5 shows a graph illustrating isolation characteristics of a transmission filter unit in a reception frequency band in the filter device of the example and in the filter device of the comparative example.

FIG. 5 shows a graph illustrating isolation characteristics of a transmission filter unit in a reception frequency band in the filter device of the example and in the filter device of the comparative example. The inductance of the second inductor L2 is much smaller in the example, which is illustrated by an alternate long and short dash line, than in the comparative example, which is illustrated by a solid line (approximately 0.016 times). Despite the fact that the inductance is small in the example, from the results illustrated in FIG. 5, the waveform representing the insertion loss in the passband (transmission frequency band: 824 MHz to 849 MHz) of the transmission filter unit in the example is superimposed with the waveform of the comparative example. That is, it is clear that the insertion loss characteristics of the example are similar to those of the comparative example.

In addition, regarding the insertion loss (isolation characteristics) of the transmission filter unit in the reception frequency band of the reception filter unit (869 MHz to 894 MHz), it is preferable that the minimum value of insertion loss within the reception frequency band be large. From FIG. 5, the minimum value of the insertion loss at the high frequency side, 894 MHz, of the reception frequency band is 58 dB in the example and is 55 dB in the comparative example. Therefore, it is clear that the minimum value is 3 dB larger in the example than in the comparative example and isolation characteristics in the reception frequency band are excellent.

In addition, it is clear that attenuation is around 1 dB larger in the stop band on the high-frequency side outside the reception frequency band in the example than in the comparative example.

From the above-described results, it is clear that the inductance of the second inductor is reduced while suppressing an increase in insertion loss in the passband and securing a large attenuation in the stop band, by connecting the second inductor in series between the filter unit and the signal terminal.

Thus, in this preferred embodiment, since the inductance of the second inductor L2 is reduced, it is possible to configure the second inductor L2 from the wiring line 24a inside the wiring board 21. Therefore, the number of inductor chips that need to be mounted on the wiring board 21 is reduced. Therefore, the filter device 1 is reduced in size.

In addition, in this preferred embodiment, an example has been described in which the filter device 1 includes a plurality of filter units 13 and 14. However, the present invention is not limited to this configuration. In the present invention, it is possible for the filter device to include only a single filter unit. In addition, the second inductor may be connected to the reception filter unit or to another filter unit such as one configured to receive a global positioning system (GPS) signal.

The filter unit need not be a ladder-type elastic wave filter unit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first signal terminal;
   a second signal terminal;
   a filter unit connected between the first signal terminal and the second signal terminal;
   a first inductor connected between a connection point between the filter unit and the first signal terminal, and a ground potential;
   a second inductor connected between the filter unit and the second signal terminal and electromagnetically coupled with the first inductor;
   a substrate;
   an inductor chip defining the first inductor and mounted on the substrate; and
   a wiring line that is provided inside the substrate and defines the second inductor.

2. The filter device according to claim 1, wherein the filter unit is an unbalanced filter unit that outputs an unbalanced signal.

3. The filter device according to claim 1, wherein the filter unit includes a transmission filter unit and a reception filter unit defined by a filter chip.

4. The filter device according to claim 1, wherein the inductor chip and the wiring line face each other in a thickness direction of the substrate.

5. The filter device according to claim 4, wherein the inductor chip and the wiring line face each other without there being any electrodes therebetween.

6. The filter device according to claim 1, wherein the filter unit includes a reception filter unit and a transmission filter unit, and the second inductor is connected to one of the reception filter unit and another filter unit that is different from the filter unit and configured to receive a global positioning system signal.

7. A filter device comprising:
a first signal terminal;
a second signal terminal;
a filter unit connected between the first signal terminal and the second signal terminal;
a first inductor connected between a connection point between the filter unit and the first signal terminal, and a ground potential; and
a second inductor connected between the filter unit and the second signal terminal and electromagnetically coupled with the first inductor; wherein
the first signal terminal is an antenna signal terminal that is connected to an antenna;
the second signal terminal is a transmission signal terminal that is connected to a transmission circuit; and
the filter unit is a ladder-type elastic wave filter circuit that includes a series arm resonator and a parallel arm resonator.

8. A filter device comprising:
a first signal terminal;
a second signal terminal;
a filter unit connected between the first signal terminal and the second signal terminal;
a first inductor connected between a connection point between the filter unit and the first signal terminal, and a ground potential;
a second inductor connected between the filter unit and the second signal terminal and electromagnetically coupled with the first inductor;
a third signal terminal; and
one other filter unit connected between a connection point between the first signal terminal and the filter unit, and the third signal terminal; wherein
the other filter unit and the filter unit have different pass bands; and
the first and second inductors are configured such that a signal that has a phase and amplitude that weaken a signal located in a passband of the other filter unit that passes through the filter unit flows from one of the first and second signal terminals to the other of the first and second signal terminals by passing through the first and second inductors, which are electromagnetically coupled with each other, and not passing through the filter unit.

9. The filter device according to claim 8, wherein the first and second inductors are configured such that a signal that has a phase that is opposite to that of a signal of at least a portion of a frequency band of the signals located in the passband of the other filter unit that passes through the filter unit flows from one of the first and second signal terminals to the other of the first and second signal terminals by passing through the first and second inductors, which are electromagnetically coupled with each other and not passing through the filter unit.

10. The filter device according to claim 9, wherein the first and second inductors are configured such that the signal of at least a portion of the frequency band of the signals located in the passband of the other filter unit that passes through the filter unit and the signal that flows from one of the first and second signal terminals to the other of the first and second signal terminals by passing through the first and second inductors, which are electromagnetically coupled with each other, and not passing through the filter unit have phases opposite to each other and the same amplitude.

11. The filter device according to claim 8, wherein
the third signal terminal is a reception signal terminal that is connected to a reception circuit; and
the other filter unit is a longitudinally coupled resonator type elastic wave filter circuit.

12. The filter device according to claim 8, wherein the other filter unit is one of a balanced filter unit and an unbalanced filter unit.

13. The filter device according to claim 8, wherein the filter unit is a transmission filter unit and the other filter unit is a reception filter unit.

14. A filter device comprising:
a first signal terminal;
a second signal terminal;
a filter unit connected between the first signal terminal and the second signal terminal;
a first inductor connected between a connection point between the filter unit and the first signal terminal, and a ground potential; and
a second inductor connected between the filter unit and the second signal terminal and electromagnetically coupled with the first inductor; wherein
the first and second inductors are inductors configured to adjust impedance and to define a sub-route to increase attenuation in a reception frequency band in the filter unit.

15. The filter device according to claim 14, wherein the sub-route is provided between the first signal terminal and the second terminal and passes through the first and second inductors, which are electromagnetically coupled with each other, but does not pass through the filter unit.

* * * * *